United States Patent
Qiao

(10) Patent No.: US 10,968,509 B2
(45) Date of Patent: Apr. 6, 2021

(54) PICKING ASSEMBLY, CRUCIBLE PICKING DEVICE, AND METHOD FOR PICKING CRUCIBLE

(71) Applicant: Shenzhen China Star Optoelectronics Semiconductor Display Technology Co., Ltd., Shenzhen (CN)

(72) Inventor: Xiaoping Qiao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 192 days.

(21) Appl. No.: 16/245,238

(22) Filed: Jan. 10, 2019

(65) Prior Publication Data

US 2020/0102641 A1 Apr. 2, 2020

Related U.S. Application Data

(63) Continuation of application No. PCT/CN2018/116639, filed on Nov. 21, 2018.

(30) Foreign Application Priority Data

Sep. 27, 2018 (CN) .......................... 201811133489.4

(51) Int. Cl.
| | |
|---|---|
| *B66C 1/54* | (2006.01) |
| *C23C 14/24* | (2006.01) |
| *B01L 3/04* | (2006.01) |
| *C03B 19/09* | (2006.01) |
| *C03B 5/26* | (2006.01) |

(52) U.S. Cl.
CPC ............... *C23C 14/243* (2013.01); *B01L 3/04* (2013.01); *C03B 5/26* (2013.01); *C03B 19/09* (2013.01)

(58) Field of Classification Search
CPC .......... C23C 14/243; C03B 5/26; B67C 3/242; B65G 2201/0247
USPC ............................................... 294/93, 94, 116
See application file for complete search history.

(56) References Cited

U.S. PATENT DOCUMENTS

| | | | | |
|---|---|---|---|---|
| 1,189,107 | A |   | 6/1916 | Hescock |
| 1,441,340 | A | * | 1/1923 | Goldberg ............... B22D 45/00 294/68.3 |
| 1,864,466 | A | * | 6/1932 | Peterson ............. B25B 23/0035 403/365 |
| 2,179,594 | A | * | 11/1939 | Johnson .................. E21B 31/20 294/86.22 |

(Continued)

FOREIGN PATENT DOCUMENTS

| | | |
|---|---|---|
| CN | 1862067 A | 11/2006 |
| CN | 201364029 Y | 12/2009 |

(Continued)

*Primary Examiner* — Paul T Chin

(57) ABSTRACT

A picking assembly provided by the present disclosure may include a transmission shaft; at least two rigid balls; and a support member carrying rigid balls of the at least two rigid balls. Two of the at least two rigid balls may be arranged on two opposite sides of the transmission shaft. Centers of the two of the at least two rigid balls and a center of a cross-section of the transmission shaft may be located on a same line. The transmission shaft may be movable back and forth in an axis direction of the transmission shaft.

12 Claims, 3 Drawing Sheets

(56) References Cited

U.S. PATENT DOCUMENTS

| | | | | |
|---|---|---|---|---|
| 2,786,383 A | * | 3/1957 | Bachman | F16B 21/165 411/348 |
| 3,405,965 A | * | 10/1968 | Haas | B66C 1/54 294/82.28 |
| 3,680,906 A | * | 8/1972 | Neumeier | B66C 1/66 294/89 |
| 4,120,232 A | * | 10/1978 | Hoffman, Jr. | B64D 1/06 244/137.4 |
| 4,204,711 A | * | 5/1980 | Lancelot, III | B66C 1/666 294/82.28 |
| 2012/0174458 A1 | * | 7/2012 | Burnsed, Jr. | F41C 23/02 42/85 |

FOREIGN PATENT DOCUMENTS

| | | |
|---|---|---|
| CN | 201769118 U | 3/2011 |
| CN | 201880542 U | 6/2011 |
| CN | 105332985 A | 2/2016 |
| CN | 107164735 A | 9/2017 |

\* cited by examiner

| a picking assembly including a transmission shaft, at least two rigid balls, and a support member carrying rigid balls of the at least two rigid balls, may be provided. Two of the at least two rigid balls may be arranged on two opposite sides of the transmission shaft. Centers of the two of the at least two rigid balls and a center of a cross-section of the transmission shaft may be located on a same line. The transmission shaft may be movable back and forth in an axis direction of the transmission shaft. | ~S41 |

| one end of the support member and the at least two rigid balls may be inserted into a crucible. | ~S42 |

| the transmission shaft may be moved in a first direction toward the crucible to drive two of the at least two rigid balls, to move the two of the at least two rigid balls away from the center of the cross-section of the transmission shaft, so that a distance between outer edges of the two of the at least two rigid balls away from the center of the cross-section of the transmission shaft may be greater than a diameter of the opening of the crucible. | ~S43 |

| the distance between outer edges of the two of the at least two rigid balls away from the center of the cross-section of the transmission shaft greater than the diameter of the opening of the crucible may be maintained, and the picking assembly may be moved in a second direction opposite to the first direction until the crucible is picked. | ~S44 |

Fig. 4

PICKING ASSEMBLY, CRUCIBLE PICKING DEVICE, AND METHOD FOR PICKING CRUCIBLE

CROSS-REFERENCE TO RELATED APPLICATIONS

The present application is a continuation-application of International (PCT) Patent Application No. PCT/CN2018/116639, filed on Nov. 21, 2018, which claims foreign priority of Chinese Patent Application No. 201811133489.4, filed on Sep. 27, 2018 in the National Intellectual Property Administration of China, the entire contents of which are hereby incorporated by reference.

FIELD

The described embodiments relate to a machine technology, and more particularly, to a picking assembly, a crucible picking device, and a method for a picking crucible.

BACKGROUND

An organic light-emitting diode (OLED) technology has characteristics of self-illumination, light weight, easy to realize flexible display and is a display technology with good development prospects. In a process of an OLED panel, a physical vapor deposition (PVD) method is generally used to realize evaporation of organic materials, thereby forming various layer structures of an OLED device. The organic material is placed in a crucible of a vacuum chamber and is heated to form a film on the substrate after sublimation or gasification, deposition, and the like. In practical applications, an opening is defined on the vacuum chamber, a diameter of the opening (radial size) is generally 6-20 millimeters. The diameter of the opening is small, and a special picking tool is required to take out the crucible from the opening and add organic material.

FIG. 1 is a structural illustration of a picking tool in the related art. Referring to FIG. 1, a picking tool 10 includes a transmission shaft 11, elastic pieces 12, and a handle 13. An upper end of the transmission shaft 11 is connected to the handle 13. The transmission shaft 11 may be moved up and down. An extending protrusion 111 is arranged on a lower end of the transmission shaft. One end of the handle 13 may be rotated around an axis of the transmission shaft 11. The elastic pieces 12 are arranged around the transmission shaft 11 and an upper end of the elastic pieces 12 is coupled to a bracket 14. When the handle 13 moves upward, the transmission shaft 11 is moved upward, and the protrusion 111 on the lower end of the transmission shaft 11 spreads the elastic pieces 12, so that a radial length of the elastic piece 12 is increased, and the elastic pieces 12 are caught inside of an opening of a crucible. Continue to move the transmission shaft 11 upward, the crucible is taken out from an opening of the vacuum chamber. However, as a number of uses and time increase, the elastic pieces 12 are easily deformed. The elastic pieces 12 are difficult to maintain its picking function, and a structure of the picking tool 10 is complicated.

SUMMARY

The present disclosure provides a picking assembly, a crucible picking device, and a method for a picking crucible, which may maintain its picking function after repeated use, and may have a simple structure and may be easy to operate.

The present disclosure provides a picking assembly configured to pick a container having an opening, and including: a transmission shaft; at least two rigid balls; and a support member carrying rigid balls of the at least two rigid balls; wherein two of the at least two rigid balls are arranged on two opposite sides of the transmission shaft; centers of the two of the at least two rigid balls and a center of a cross-section of the transmission shaft are located on a same line; the transmission shaft is movable back and forth in an axis direction of the transmission shaft; wherein when the transmission shaft moves in a first direction toward the container to drive the rigid balls, the two of the at least two rigid balls move away from the center of the cross-section of the transmission shaft, so that a distance between outer edges of the two of the at least two rigid balls away from the center of the cross-section of the transmission shaft is greater than a diameter of the opening of the container; when the transmission shaft moves in a second direction opposite the first direction, the transmission shaft is disengaged from the two of the at least two rigid balls, the two of the at least two rigid balls move toward the center of the cross-section of the transmission shaft, so that the distance between the outer edges of the two of the at least two rigid balls away from the center of the cross-section of the transmission shaft is less than the diameter of the opening of the container.

The present disclosure provides a crucible picking device, including an picking assembly, wherein the picking assembly is configured to pick a container having an opening, and includes: a transmission shaft; at least two rigid balls; and a support member carrying rigid balls of the at least two rigid balls; wherein two of the at least two rigid balls are arranged on two opposite sides of the transmission shaft; centers of the two of the at least two rigid balls and a center of a cross-section of the transmission shaft are located on a same line; the transmission shaft is movable back and forth in an axis direction of the transmission shaft; wherein when the transmission shaft moves in a first direction toward the container to drive the rigid balls, the two of the at least two rigid balls move away from the center of the cross-section of the transmission shaft, so that a distance between outer edges of the two of the at least two rigid balls away from the center of the cross-section of the transmission shaft is greater than a diameter of the opening of the container; when the transmission shaft moves in a second direction opposite the first direction, the transmission shaft is disengaged from the two of the at least two rigid balls, the two of the at least two rigid balls move toward the center of the cross-section of the transmission shaft, so that the distance between the outer edges of the two of the at least two rigid balls away from the center of the cross-section of the transmission shaft is less than the diameter of the opening of the container.

The present disclosure provides a method for picking a crucible, including: providing a picking assembly including: a transmission shaft; at least two rigid balls; and a support member carrying rigid balls of the at least two rigid balls; wherein two of the at least two rigid balls are arranged on two opposite sides of the transmission shaft; centers of the two of the at least two rigid balls and a center of a cross-section of the transmission shaft are located on a same line; the transmission shaft is movable back and forth in an axis direction of the transmission shaft; inserting one end of the support member and the at least two rigid balls into the crucible; moving the transmission shaft in a first direction toward the crucible to drive two of the at least two rigid balls, to move the two of the at least two rigid balls away from the center of the cross-section of the transmission shaft, so that a distance between outer edges of the two of the at least two rigid balls away from the center of the cross-section of the transmission shaft is greater than a diameter of the opening of the crucible; maintaining the distance between outer edges of the two of the at least two rigid balls away from the center of the cross-section of the transmission shaft greater than the diameter of the opening of the crucible, and moving the picking assembly in a second direction opposite to the first direction until the crucible is picked.

Advantages of the disclosure may follow. As compared with the related art, the present disclosure may provide a picking assembly including a transmission shaft, at least two rigid balls, and a support member carrying rigid balls of the at least two rigid balls. Two of the at least two rigid balls may be arranged on two opposite sides of the transmission shaft. Centers of the two of the at least two rigid balls and a center of a cross-section of the transmission shaft may be located on a same line. The transmission shaft may be movable back and forth in an axis direction of the transmission shaft. It may only need to move the transmission shaft in a first direction toward the container to drive the rigid balls, and the two of the at least two rigid balls move away from the center of the cross-section of the transmission shaft, until a distance between outer edges of the two of the at least two rigid balls away from the center of the cross-section of the transmission shaft is greater than a diameter of the opening of the container. The picking assembly may be moved in a second direction opposite to the first direction until the crucible is picked. The picking assembly may have a simple structure, and may be easy to be handled. The at least two rigid balls may be not easily deformed, and may maintain its picking function after repeated use.

BRIEF DESCRIPTION OF THE DRAWINGS

FIG. 4 is a flow chart of a method for picking a crucible in accordance with an embodiment in the present disclosure.

DETAILED DESCRIPTION

Figure 1:
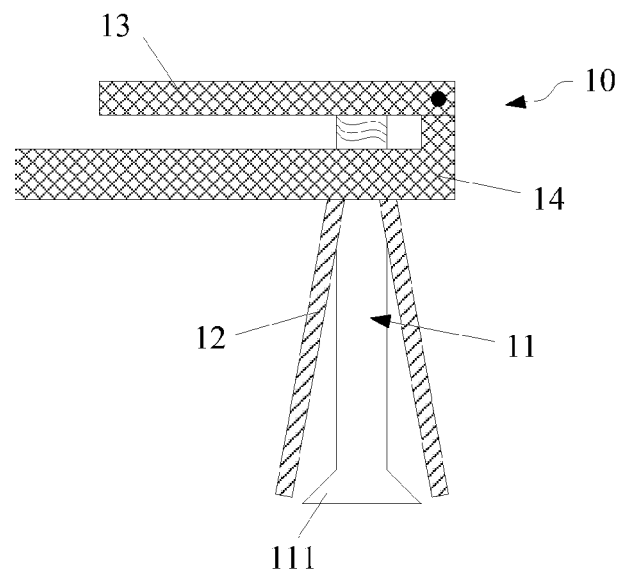
FIG. 1 is a structural illustration of a picking tool in the related art.

A main purpose of the present disclosure is to provide a picking assembly including a transmission shaft, at least two rigid balls, and a support member carrying rigid balls of the at least two rigid balls. Two of the at least two rigid balls may be arranged on two opposite sides of the transmission shaft. Centers of the two of the at least two rigid balls and a center of a cross-section of the transmission shaft may be located on a same line. The transmission shaft may be movable back and forth in an axis direction of the transmission shaft. It may only need to move the transmission shaft in a first direction toward the container to drive the rigid balls, and the two of the at least two rigid balls move away from the center of the cross-section of the transmission shaft, until a distance between outer edges of the two of the at least two rigid balls away from the center of the cross-section of the transmission shaft is greater than a diameter of the opening of the container. The picking assembly may be moved in a second direction opposite to the first direction until the crucible is picked. The picking assembly may have a simple structure, and may be easy to be handled. The at least two rigid balls may be not easily deformed, and may maintain its picking function after repeated use.

In the specification of the present disclosure, it is to be understood that terms such as "upper", "lower", "upward", "downward", "leftward", and "rightward" refer to the orientations and locational relations illustrated in the drawings, and for describing the present disclosure and for describing in a simple manner, and which are not intended to indicate or imply that the device or the elements are disposed to locate at the specific directions or are structured and performed in the specific directions, which could not to be understood as limiting the present disclosure.

Figure 2:
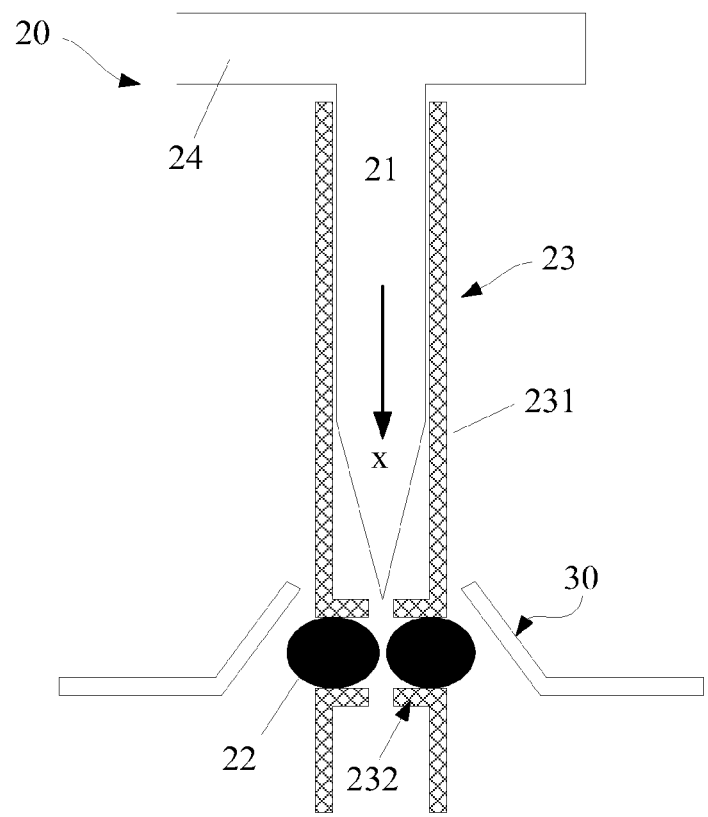
FIG. 2 is a structural illustration of a picking assembly in accordance with an embodiment in the present disclosure.

FIG. 2 is a structural illustration of a picking assembly in accordance with an embodiment in the present disclosure. As shown in FIG. 2, in this embodiment, the picking assembly 20 may include a transmission shaft 21, four rigid balls 22, and a support member 23 carrying the four rigid balls 22. The transmission shaft 21 may be a rod-shaped member having a circular cross-section. A lower end of the transmission shaft 21 may be pointed. Correspondingly, the support member 23 may be an inner hollow cylindrical sleeve. The transmission shaft 21 may be inserted into an inner cylinder wall 231 of the sleeve 23. In this embodiment, a diameter of the sleeve 23 may be set to be similar to a diameter of the transmission shaft 21. Therefore, the inner cylinder wall 231 of the sleeve 23 may constrain that the transmission shaft 21 may only move upward and downward in a direction of an axis of the transmission shaft 21, and the transmission shaft 21 may not move in a radial direction of a cross-section of the transmission shaft 21.

A first spiral may be defined on the transmission shaft 21. A second spiral may be defined on the inner cylinder wall 231 of the sleeve 23. The first spiral and the second spiral may be engaged. By screwing the transmission shaft 21 in different directions, the transmission shaft 21 may be moved upward and downward relative to the inner cylinder wall 231 in the direction of the axis of the transmission shaft 21. For example, the transmission shaft 21 may be screwed counterclockwise, and the transmission shaft 21 may be moved upward relative to the inner cylinder wall 231 in the direction of the axis of the transmission shaft 21; the transmission shaft 21 may be screwed clockwise, and the transmission shaft 21 may be moved downward relative to the inner cylinder wall 231 in the direction of the axis of the transmission shaft 21.

The sleeve may include the inner cylinder wall 231 and a plurality of extending portions 232 connected to the cylinder wall 231 and extending toward the center of the cross-section of the sleeve 23. The plurality of extending portions 232 may be divided into an upper group and a lower group in a first direction x shown in FIG. 2. The four rigid balls 22 may be sandwiched between the upper group and the lower group of the plurality of extending portions 232.

The plurality of extending portions 232 may be configured to carry the four rigid balls 22. Each extending portion 232 may include four horizontal members, and two of the four horizontal members may be located on the upper group and the other two of the four horizontal members may be located on the lower group. The four horizontal members may be arranged around one of the four rigid balls 22. Therefore, the four rigid balls 22 may be only movable in the radial direction of the cross-section of the transmission shaft 21. Each rigid ball 22 may only move leftward and rightward in FIG. 2, and may not move upward and downward.

Figure 3:
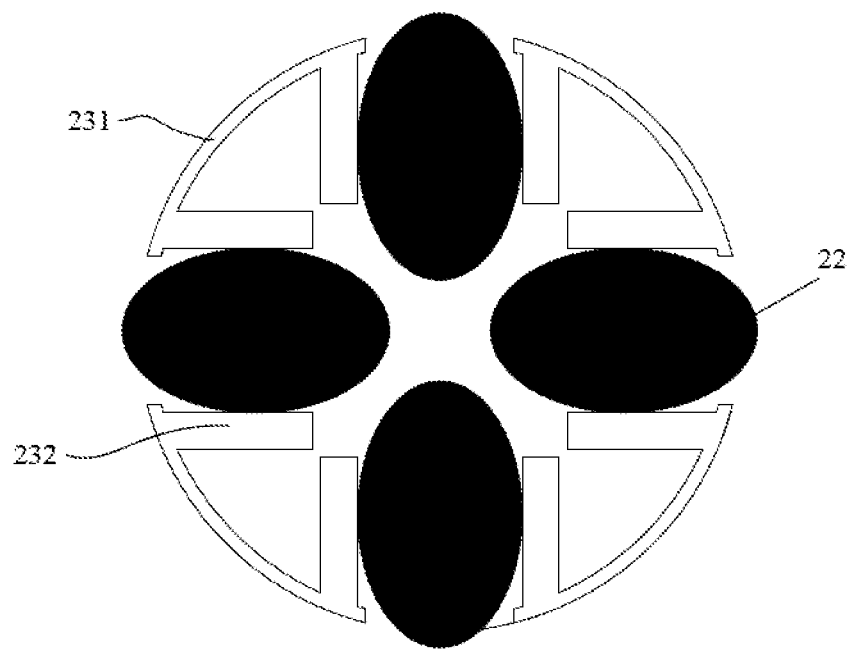
FIG. 3 is a cross-section view of a picking assembly shown in FIG. 2.

Referring to FIG. 3, the four rigid balls 22 may be same and may have an elliptical cross-section. A long axis of each rigid ball 22 may be arranged along the radial direction of the cross-section of the transmission shaft 21. In other embodiments, the four rigid balls 22 may also have a circular cross-section.

The four rigid balls 22 may be arranged in two groups, and two rigid balls 22 of each group may be arranged on opposite sides of the transmission shaft 21. Centers of the two of the four rigid balls 22 in any one group and a center of a cross-section of the transmission shaft 21 may be located on a same line. As shown in FIG. 3, two rigid balls 22 arranged on up and down are a group, and the other two rigid balls 22 arranged on left and right are a group. The Long axes of rigid balls 22 of the two groups may be perpendicular.

In this embodiment, the four rigid balls 22 and a lower end of the support member 23 may be inserted into a crucible 30. The transmission shaft 21 may be moved in the first direction x. The pointed lower end of the transmission shaft 21 may be inserted into the gap of the four rigid balls 22. When the transmission shaft 21 continued to move in the first direction x, the pointed lower end of the transmission shaft 21 may contact to the four rigid balls 22, to drive the four rigid balls 22 to move away from the center of the cross-section of the transmission shaft 21 in the radial direction of the cross-section of the transmission shaft 21. When a distance between outer edges of two of the four rigid balls 22 in a group away from the center of the cross-section of the transmission shaft 21 is greater than a diameter of a opening of the crucible 30, maintaining the distance between outer edges of two of the four rigid balls 22 in the group away from the center of the cross-section of the transmission shaft 21, and moving the transmission shaft 21 in a second direction opposite the first direction x, so that the crucible 30 may be taken out from an opening of a vacuum chamber.

Compared with the elastic pieces 12 shown in FIG. 1, the rigid balls 22 may be not easily deformed, and may maintain its picking function after repeated use. In the practical application scenario, in order to further improve the characteristic that the rigid ball 22 is not easily deformed, the rigid ball 22 of this embodiment may be made of a metal having a higher hardness.

Referring to FIG. 2 and FIG. 3, after the crucible 30 is taken out from the opening of the vacuum chamber, the transmission shaft 21 may move in a second direction opposite to the first direction x, until the pointed lower end of the transmission shaft 21 disengages from the four rigid balls 22. The picking assembly 20 may be moved upward in the second direction. The four rigid balls 22 may move toward the center of the cross-section of the transmission shaft 21 by touching the opening edge of the crucible 30. The distance between outer edges of two of the four rigid balls 22 in the group away from the center of the cross-section of the transmission shaft 21 may be less than the diameter of the opening of the crucible 30, so that the picking assembly 20 may be taken out from the crucible 30.

In order to move the transmission shaft 21 easily, as shown in FIG. 2, a handle 24 may be arranged on an upper end of the transmission shaft 21. The handle 24 may be vertically arranged the upper end of the transmission shaft 21 away from the rigid balls 22. When the handle 24 is operated, transmission shaft 21 may move upward and downward.

In an embodiment, the present disclosure further provides a picking assembly based on the picking assembly 20 in the above-mentioned embodiment. The different is that two rigid balls 22 may arranged in the picking assembly in this embodiment on opposite sides of the transmission shaft 21. Centers of the two rigid balls 22 and a center of a cross-section of the transmission shaft 21 may be located on a same line.

In an embodiment, the present disclosure further provides a crucible picking device. The crucible picking device may include the above-mentioned picking assembly, and thus it may also have same picking functions.

FIG. 4 is a flow chart of a method for picking a crucible in accordance with an embodiment in the present disclosure. Referring to FIG. 4, a method for picking a crucible may include operations in the following blocks S41 to S44.

Block S41, a picking assembly including a transmission shaft, at least two rigid balls, and a support member carrying rigid balls of the at least two rigid balls, may be provided. Two of the at least two rigid balls may be arranged on two opposite sides of the transmission shaft. Centers of the two of the at least two rigid balls and a center of a cross-section of the transmission shaft may be located on a same line. The transmission shaft may be movable back and forth in an axis direction of the transmission shaft.

Block S42, one end of the support member and the at least two rigid balls may be inserted into a crucible.

Block S43, the transmission shaft may be moved in a first direction toward the crucible to drive two of the at least two rigid balls, to move the two of the at least two rigid balls away from the center of the cross-section of the transmission shaft, so that a distance between outer edges of the two of the at least two rigid balls away from the center of the cross-section of the transmission shaft may be greater than a diameter of the opening of the crucible.

Block S44, the distance between outer edges of the two of the at least two rigid balls away from the center of the cross-section of the transmission shaft greater than the diameter of the opening of the crucible may be maintained, and the picking assembly may be moved in a second direction opposite to the first direction until the crucible is picked.

In an embodiment, the method for picking the crucible may be based on any of the above-mentioned the picking assembly, such as the picking assembly 20. Therefore, the method for picking the crucible may also have same picking functions.

In additional, after the crucible is picked, the method may further include the following operations. The transmission shaft may be moved in the second direction to disengage the transmission shaft from the two of the at least two rigid balls, to move the two of the at least two rigid balls toward the center of the cross-section of the transmission shaft. The distance between the outer edges of the two of the at least two rigid balls away from the center of the cross-section of the transmission shaft may be less than the diameter of the opening of the crucible. Therefore, the one end of the support member and the two of the at least two rigid balls may be taken out from the crucible.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A picking assembly configured to pick a container having an opening, and comprising:
   a transmission shaft;
   at least two rigid balls; and a support member carrying rigid balls of the at least two rigid balls;

wherein
two of the at least two rigid balls are arranged on two opposite sides of the transmission shaft;
centers of the two of the at least two rigid balls and a center of a cross-section of the transmission shaft are located on a same line;
the transmission shaft is movable back and forth in an axis direction of the transmission shaft;

wherein
when the transmission shaft moves in a first direction toward the container to drive the rigid balls, the two of the at least two rigid balls move away from the center of the cross-section of the transmission shaft, so that a distance between outer edges of the two of the at least two rigid balls away from the center of the cross-section of the transmission shaft is greater than a diameter of the opening of the container;
when the transmission shaft moves in a second direction opposite the first direction, the transmission shaft is disengaged from the two of the at least two rigid balls, the two of the at least two rigid balls move toward the center of the cross-section of the transmission shaft, so that the distance between the outer edges of the two of the at least two rigid balls away from the center of the cross-section of the transmission shaft is less than the diameter of the opening of the container;
wherein a number of the at least two rigid balls is four;
the four rigid balls are arranged in groups of two;
centers of the two rigid balls in any one group and the center of the cross-section of the transmission shaft are located on a same line;
wherein the support member is a sleeve;
the sleeve comprises an inner cylinder wall and a plurality of extending portions connected to the cylinder wall and extending toward the center of the cross-section of the transmission shaft;
the plurality of extending portions are divided into an upper group and a lower group in an extending direction of the sleeve and arranged on the inner cylinder wall of the sleeve;
the at least two rigid balls are sandwiched between the upper group and the lower group of the plurality of extending portions;
the at least two rigid balls are movable in a radial direction of the cross-section of the transmission shaft.

2. The picking assembly according to claim 1, wherein the at least two rigid balls have a circular or elliptical cross-section.

3. The picking assembly according to claim 1, wherein the transmission shaft is inserted into the sleeve;
a first spiral is defined on the transmission shaft;
a second spiral is defined on the inner cylinder wall of the sleeve;
the first spiral and the second spiral are engaged.

4. The picking assembly according to claim 1, wherein one end of the transmission shaft adjacent to the at least two rigid balls is pointed.

5. The picking assembly according to claim 1, further comprising:
a handle is arranged on one end of the transmission shaft away from the at least two rigid balls.

6. A crucible picking device, comprising an picking assembly, wherein
the picking assembly is configured to pick a container having an opening, and comprises:
a transmission shaft;
at least two rigid balls; and
a support member carrying rigid balls of the at least two rigid balls;

wherein
two of the at least two rigid balls are arranged on two opposite sides of the transmission shaft;
centers of the two of the at least two rigid balls and a center of a cross-section of the transmission shaft are located on a same line;
the transmission shaft is movable back and forth in an axis direction of the transmission shaft;

wherein
when the transmission shaft moves in a first direction toward the container to drive the rigid balls, the two of the at least two rigid balls move away from the center of the cross-section of the transmission shaft, so that a distance between outer edges of the two of the at least two rigid balls away from the center of the cross-section of the transmission shaft is greater than a diameter of the opening of the container;
when the transmission shaft moves in a second direction opposite the first direction, the transmission shaft is disengaged from the two of the at least two rigid balls, the two of the at least two rigid balls move toward the center of the cross-section of the transmission shaft, so that the distance between the outer edges of the two of the at least two rigid balls away from the center of the cross-section of the transmission shaft is less than the diameter of the opening of the container;
wherein a number of the at least two rigid balls is four;
the four rigid balls are arranged in groups of two;
centers of the two rigid balls of any one group and the center of the cross-section of the transmission shaft are located on a same line;
wherein the support member is a sleeve;
the sleeve comprises an inner cylinder wall and a plurality of extending portions connected to the cylinder wall and extending toward the center of the cross-section of the sleeve;
the plurality of extending portions are divided into an upper group and a lower group in an extending direction of the sleeve and arranged on the inner cylinder wall of the sleeve;
the at least two rigid balls are sandwiched between the upper group and the lower group of the plurality of extending portions;
the at least two rigid balls are movable in the radial direction of the cross-section of the transmission shaft.

7. The crucible picking device according to claim 6, wherein
the at least two rigid balls have a circular or elliptical cross-section.

8. The crucible picking device according to claim 6, wherein
the transmission shaft is inserted into the sleeve;
a first spiral is defined on the transmission shaft;
a second spiral is defined on the inner cylinder wall of the sleeve;
the first spiral and the second spiral are engaged.

9. The crucible picking device according to claim 6, wherein
one end of the transmission shaft adjacent to the at least two rigid balls is pointed.

10. The crucible picking device according to claim 6, wherein a handle is arranged on one end of the transmission shaft away from the at least two rigid balls.

11. A method for picking a crucible, comprising:
providing a picking assembly comprising:
a transmission shaft;
at least two rigid balls; and
a support member carrying rigid balls of the at least two rigid balls;
wherein
two of the at least two rigid balls are arranged on two opposite sides of the transmission shaft;
centers of the two of the at least two rigid balls and a center of a cross-section of the transmission shaft are located on a same line;
the transmission shaft is movable back and forth in an axis direction of the transmission shaft;
inserting one end of the support member and the at least two rigid balls into a crucible;
moving the transmission shaft in a first direction toward the crucible to drive two of the at least two rigid balls, to move the two of the at least two rigid balls away from the center of the cross-section of the transmission shaft, so that a distance between outer edges of the two of the at least two rigid balls away from the center of the cross-section of the transmission shaft is greater than a diameter of the opening of the crucible;
maintaining the distance between outer edges of the two of the at least two rigid balls away from the center of the cross-section of the transmission shaft greater than the diameter of the opening of the crucible, and moving the picking assembly in a second direction opposite to the first direction until the crucible is picked;
wherein a number of the at least two rigid balls is four;
the four rigid balls are arranged in groups of two;
centers of the two rigid balls in any one group and the center of the cross-section of the transmission shaft are located on a same line;
wherein the support member is a sleeve;
the sleeve comprises an inner cylinder wall and a plurality of extending portions connected to the cylinder wall and extending toward the center of the cross-section of the transmission shaft;
the plurality of extending portions are divided into an upper group and a lower group in an extending direction of the sleeve and arranged on the inner cylinder wall of the sleeve;
the at least two rigid balls are sandwiched between the upper group and the lower group of the plurality of extending portions;
the at least two rigid balls are movable in a radial direction of the cross-section of the transmission shaft.

12. The method according to claim 11, wherein
after the crucible is picked, the method further comprises:
moving the transmission shaft in the second direction to disengage the transmission shaft from the two of the at least two rigid balls, to move the two of the at least two rigid balls toward the center of the cross-section of the transmission shaft, so that the distance between the outer edges of the two of the at least two rigid balls away from the center of the cross-section of the transmission shaft is less than the diameter of the opening of the crucible, and the one end of the support member and the two of the at least two rigid balls are taken out from the crucible.

\* \* \* \* \*